US012543371B2

(12) United States Patent
Yang et al.

(10) Patent No.: US 12,543,371 B2
(45) Date of Patent: Feb. 3, 2026

(54) DISPLAY SUBSTRATE AND DISPLAY DEVICE (71) Applicants: Nanjing BOE Display Technology CO., LTD, Jiangsu (CN); BOE TECHNOLOGY GROUP CO., LTD., Beijing (CN)

(72) Inventors: Wei Yang, Beijing (CN); Hongtao Huang, Beijing (CN)

(73) Assignees: Nanjing BOE Display Technology CO., LTD, Jiangsu (CN); BOE TECHNOLOGY GROUP CO., LTD., Beijing (CN)

(*) Notice: Subject to any disclaimer, the term of this patent is extended or adjusted under 35 U.S.C. 154(b) by 404 days.

(21) Appl. No.: 18/023,351

(22) PCT Filed: Apr. 29, 2022

(86) PCT No.: PCT/CN2022/090169
§ 371 (c)(1),
(2) Date: Feb. 25, 2023

(87) PCT Pub. No.: WO2023/206328
PCT Pub. Date: Nov. 2, 2023

(65) Prior Publication Data
US 2024/0274619 A1    Aug. 15, 2024

(51) Int. Cl.
*H10D 86/40* (2025.01)
(52) U.S. Cl.
CPC ......... *H10D 86/441* (2025.01); *H10D 86/423* (2025.01)

(58) Field of Classification Search
CPC .................. H10D 86/441; H10D 86/423
See application file for complete search history.

(56) References Cited

U.S. PATENT DOCUMENTS 5,289,174 A * 2/1994 Suzuki ............... G09G 3/3648
345/98
2013/0134426 A1* 5/2013 Kim ................... H10D 86/451
257/59
(Continued)

FOREIGN PATENT DOCUMENTS

CN    101174067 A    5/2008
CN    102110691 A    6/2011
(Continued)

*Primary Examiner* — Peter M Albrecht
(74) *Attorney, Agent, or Firm* — HOUTTEMAN LAW LLC (57) ABSTRACT Provided are a display substrate and a display device. The display substrate includes: a base, gat scanning lines and data signal lines on the base and intersected with each other, and pixel units; each pixel unit has a pixel display area and a driving device area, a portion of the gate scanning line is bent towards the pixel display area to form a bent portion; each pixel unit includes thin film transistors in the driving device area, each thin film transistor includes a semiconductor layer; length directions of the bent portion and the semiconductor layer intersects, orthographic projections of the bent portion and the semiconductor layer on the base at least partially overlaps; a part of the semiconductor layer overlapping with the bent portion forms a channel, and a part of the bent portion overlapping with the semiconductor layer serves as a gate electrode of the thin film transistor.

13 Claims, 7 Drawing Sheets (56) References Cited

U.S. PATENT DOCUMENTS

| | | | |
|---|---|---|---|
| 2018/0226438 A1* | 8/2018 | Liu | H10D 86/0231 |
| 2019/0088784 A1* | 3/2019 | Liu | H10D 86/423 |
| 2019/0155119 A1 | 5/2019 | Matsukizono | |
| 2021/0336066 A1 | 10/2021 | Li et al. | |

FOREIGN PATENT DOCUMENTS

| | | | | |
|---|---|---|---|---|
| CN | 106373966 A | | 2/2017 | |
| CN | 106684101 A | | 5/2017 | |
| CN | 113009743 A | * | 6/2021 | ........... G02F 1/1362 |
| CN | 215067644 U | | 12/2021 | |
| CN | 113946074 A | | 1/2022 | |
| CN | 114005881 A | | 2/2022 | |
| JP | 2009300477 A | | 12/2009 | |
| KR | 19960018737 A | * | 6/1996 | |
| WO | WO2018086214 A1 | | 5/2018 | |
| WO | WO2020179026 A1 | | 9/2020 | |

\* cited by examiner

DISPLAY SUBSTRATE AND DISPLAY DEVICE

TECHNICAL FIELD

The present disclosure relates to the field of display technology, and particularly relates to a display substrate and a display device.

BACKGROUND

Since no overlapping region exists between a gate electrode and drain and source electrodes, the top-gate self-aligned thin film transistor has a small parasitic capacitance, thus causes, when applied to a pixel circuit of a display panel, a low signal delay on a gate scanning line and a data signal line, a fast pixel charging and discharging speed, and has obvious advantages in the aspect of display of an Organic Light-Emitting Diode (OLED) display substrate and a Liquid Crystal Display (LCD) substrate with high resolution.

However, for a top-gate self-aligned oxide thin film transistor, since the oxide thin film transistor is sensitive to light, in order to achieve stable device characteristics, a metal light-shielding layer having a shielding effect on a semiconductor layer needs to be separately designed, and an area of the metal light-shielding layer depends on the requirement for stability of actual oxide characteristics, and usually, an area occupied by the metal light-shielding layer is relatively large. When the top-gate self-aligned oxide thin film transistor is applied to a pixel of an LCD display panel, the structure including the metal light-shielding layer has a great influence on an aperture ratio of the pixel, and if a structural design of the thin film transistor in the pixel is not good, the aperture ratio of the pixel is easily decreased, which affects the performance of the product.

SUMMARY

The present disclosure is directed to solve at least one of the technical problems in the related art, and provides a display substrate and a display device.

In a first aspect, an embodiment of the present disclosure provides a display substrate, including: a base, gat scanning lines and data signal lines which are arranged on the base and intersected with each other, and pixel units arranged in regions defined by the gate scanning lines and the data signal lines;

each pixel unit has a pixel display area and a driving device area arranged on a side of the pixel display area, each gate scanning line runs through the driving device area, and a portion of the gate scanning line is bent towards the pixel display area to form a bent portion;

each pixel unit includes a plurality of thin film transistors disposed in the driving device area, and each thin film transistor includes a semiconductor layer on the base;

a length direction of the bent portion is intersected with a length direction of the semiconductor layer, and an orthographic projection of the bent portion on the base is at least partially overlapped with an orthographic projection of the semiconductor layer on the base; and a part of the semiconductor layer overlapping with the bent portion forms a channel, and a part of the bent portion overlapping with the semiconductor layer serves as a gate electrode of the thin film transistor.

In some implementations, an included angle between the length direction of the bent portion and an extending direction in which the gate scanning line extends ranges from 30 degrees to 60 degrees.

In some implementations, an included angle between the length direction of the bent portion and the length direction of the semiconductor layer ranges from 60 degrees to 90 degrees.

In some implementations, the semiconductor layer further includes a source electrode and a drain electrode respectively arranged at two ends of the channel; and the source electrode and the drain electrode are formed by a conductive treatment.

In some implementations, the display substrate further includes an interlayer insulating layer located on a side, away from the base, of the source electrode and the drain electrode, where the drain electrode is electrically connected to the data signal line through a via hole penetrating through the interlayer insulating layer.

In some implementations, the display substrate further includes a first passivation layer, a second passivation layer and a pixel electrode sequentially arranged on the interlayer insulating layer along a direction away from the base, where the source electrode is electrically connected to the pixel electrode through a via hole penetrating through the interlayer insulating layer, the first passivation layer, and the second passivation layer.

In some implementations, the display substrate further includes a common electrode located between the first passivation layer and the second passivation layer, where an orthographic projection of the common electrode on the base at least partially overlaps with an orthographic projection of the pixel electrode on the base.

In some implementations, the display substrate further includes a planarization layer located between the first passivation layer and the second passivation layer, where the source electrode is electrically connected to the pixel electrode through a via hole penetrating through the interlayer insulating layer, the first passivation layer, the planarization layer, and the second passivation layer.

In some implementations, the display substrate further includes a common electrode located between the planarization layer and the second passivation layer, where an orthographic projection of the common electrode on the base at least partially overlaps with an orthographic projection of the pixel electrode on the base.

In some implementations, the display substrate further includes a common electrode located on a side, away from the base, of the second passivation layer, where an orthographic projection of the common electrode on the base at least partially overlaps with an orthographic projection of the pixel electrode on the base.

In some implementations, the display substrate further includes a light-shielding layer located between the base and the channel, where an orthographic projection of the channel on the base falls within an orthographic projection of the light-shielding layer on the base.

In a second aspect, an embodiment of the present disclosure provides a display device, including the display substrate as described above.

DETAIL DESCRIPTION OF EMBODIMENTS

In order to make technical solutions of the present disclosure better understood, the present disclosure is further described in detail below with reference to the accompanying drawings and implementations.

Unless defined otherwise, technical or scientific terms used herein shall have the ordinary meaning as understood by one of ordinary skill in the art to which this disclosure belongs. The use of "first," "second," and the like in this disclosure is not intended to indicate any order, quantity, or importance, but rather is used to distinguish one element from another. Also, the use of the terms "a," "an," or "the" and similar referents does not denote a limitation of quantity, but rather denotes the presence of at least one. The word "comprising/including" or "comprises/includes", and the like, means that the element or item preceding the word contains the element or item listed after the word and its equivalent, but does not exclude other elements or items. The terms "connected" or "coupled" and the like are not restricted to physical or mechanical connections, but may include electrical connections, whether direct or indirect. Terms "upper/on", "lower/below", "left", "right", and the like are used only to indicate relative positional relationships, and when an absolute position of an object being described is changed, the relative positional relationships may be changed accordingly.

The transistors used in the embodiments of the present disclosure may be thin film transistors, field effect transistors or other devices with similar characteristics, and since a source and a drain of each transistor used are symmetrical, there is no difference between the source and the drain, and when one of the source and the drain is the source, the other is the drain. In addition, the transistors can be divided into an N type and a P type according to the characteristics of the transistors, when the P type transistor is adopted, the source and the drain are conducted when a low level signal is input to a gate of the transistor, and when the N type transistor is adopted, the source and the drain are conducted when a high level signal is input to the gate of the transistor. In the embodiments of the present disclosure and the following description, the thin film transistor in the display substrate may be a P-type transistor or an N-type transistor, and the specific type of the transistor may be selected as desired.

Figure 1:
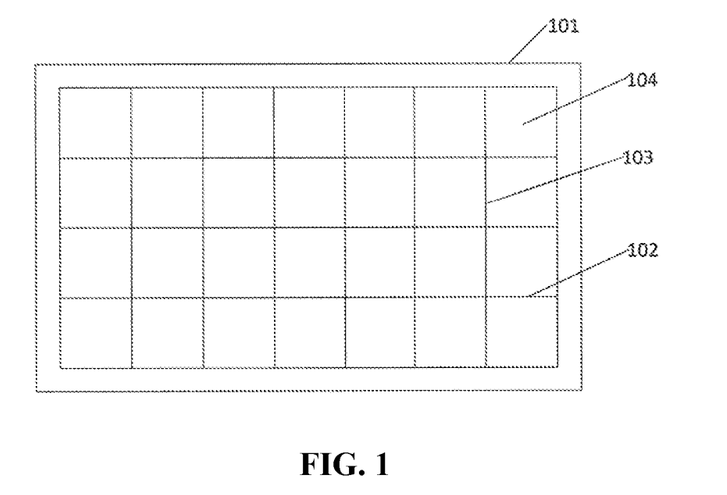
FIG. 1 is a schematic diagram of an exemplary display substrate.
Figure 2:
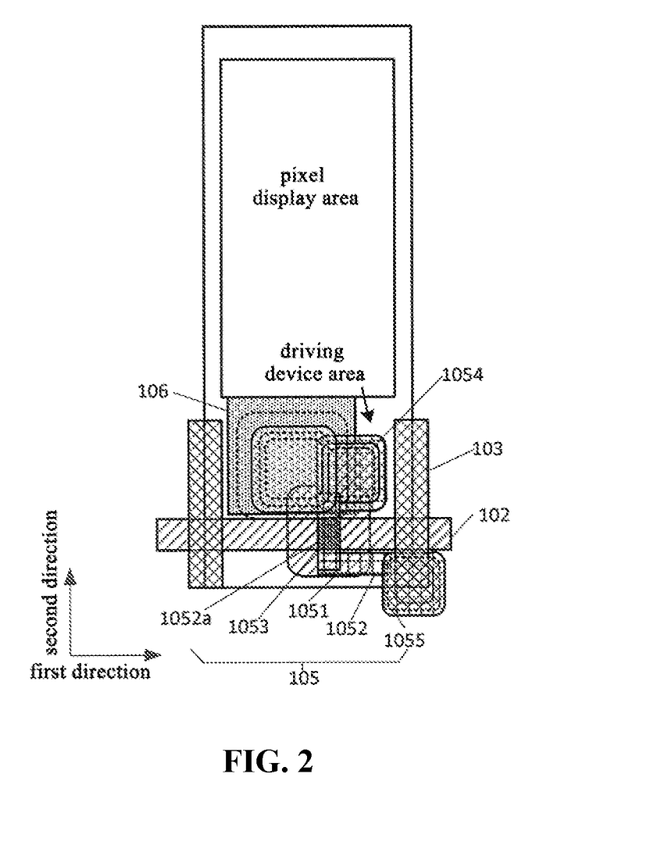
FIG. 2 is a schematic structural diagram of a pixel unit in the display substrate shown in FIG. 1.

FIG. 1 is a schematic structural diagram of an exemplary display substrate, as shown in FIG. 1, the display substrate includes: a base 101, gate scanning lines 102 and data signal lines 103 which are arranged on the base 101 and intersected with each other, and pixel units 104 located in regions defined by the gate scanning lines 102 and the data signal lines 103. FIG. 2 is a schematic structural diagram of a pixel unit in the display substrate shown in FIG. 1, and as shown in FIG. 2, each pixel unit 104 has a pixel display area and a driving device area disposed at a side of the pixel display area. The driving device area may be located on an upper side of the pixel display area, or may be located on a lower side of the pixel display area, and in the embodiment of the present disclosure and the following description, a case where the driving device area is on the lower side of the pixel display area is taken as an example. Each pixel unit 104 includes: a plurality of thin film transistors 105 disposed in the driving device area. For convenience of illustration, only one of the thin film transistors 105 is shown in FIG. 2, and the other thin film transistors 105 are similar to that shown in FIG. 2 in structure and will not be described in detail.

As shown in FIG. 2, the thin film transistor 105 includes: a light-shielding layer 1051 on the base 101, and a semiconductor layer 1052 on a side of the light-shielding layer 1051 away from the base 101. Each gate scanning line 102 may extend in a horizontal direction (i.e., a first direction shown in FIG. 2) and run through the driving device area, and, the semiconductor layer 1052 may extend in a vertical direction (i.e., a second direction shown in FIG. 2), a length direction of the semiconductor layer 1052 (i.e., the second direction shown in FIG. 2) perpendicularly intersects an extending direction in which the gate scanning line 102 extends (i.e., the first direction shown in FIG. 2), a portion of the semiconductor layer 1052 overlapping with the gate scanning line 102 forms a channel 1052a, and a portion of the gate scanning line 102 overlapping with the semiconductor layer 1052 may serve as a gate electrode 1053 of the thin film transistor 105. A source electrode 1054 and a drain electrode 1055 of the thin film transistor are located on a side of the gate electrode 1053 away from the base 101, and it should be understood that other insulating layers, such as a buffer layer, a gate insulating layer, an interlayer insulating layer, a planarization layer, a passivation layer, and the like, which are not shown in FIG. 2, may be further provided between any two adjacent conductive layers in the thin film transistor 105. The source electrode 1054 and the drain electrode 1055 are electrically connected to both ends of the semiconductor layer 1052 through via holes penetrating through an insulating layer between the source electrode 1054 and the semiconductor layer 1052, and an insulating layer between the drain electrode 1055 and the semiconductor layer 1052, respectively.

With continued reference to FIG. 2, the display substrate further includes: a pixel electrode 106 on a side of the drain electrode 1055 away from the base 101, and the source electrode 1054 of the thin film transistor 105 may be electrically connected to the pixel electrode 106. In practical applications, a gate scanning signal transmitted by the gate scanning line 102 may be transmitted to the gate electrode 1053 of the thin film transistor 105 to control the source electrode 1054 to be conducted to the drain electrode 1055, so that a data signal on the data signal line 103 is transmitted to the pixel electrode 106, so as to control, in cooperation with a common signal transmitted by a common electrode (not shown in the figure), liquid crystal molecules in a liquid crystal layer to deflect, thus light from a backlight unit is transmitted through the liquid crystal layer to realize a display function.

Meanwhile, the light-shielding layer 1051 may shield the channel 1052a of the semiconductor layer 102 to prevent light, incident from the base 101, from being irradiated to the channel 1052a of the semiconductor layer 102, so as to improve stability of the thin film transistor 105, and an area of the light-shielding layer 1051 depends on the requirement for stability of actual oxide characteristics, and an area occupied by the light-shielding layer is generally large.

When the display substrate forms a display panel together with a color filter substrate, the backlight unit and the like, a black matrix (BM) is required to shield devices, such as the gate scanning lines 102, the data signal lines 103, and the thin film transistors 105, in the display substrate, so as to avoid shielding light from the backlight unit. In practical applications, the area occupied by the gate scanning lines 102 and the data signal lines 103 may be reduced by narrowing line widths thereof, but the area occupied by the thin film transistor 105 is still relatively large, for example, in a 16-inch display substrate, as shown in FIG. 2, a total length of the thin film transistor 105 in the second direction is 21 micrometers, and a total length of the thin film transistor 105 in the first direction is equal to a distance between two adjacent data signal lines 103, so that a black matrix with a relatively large area is required to shield the thin film transistor 105, thus an effective display area in the pixel unit is reduced, thereby easily causing a decrease in the aperture ratio of the pixel in the display substrate, resulting in a decrease in light transmittance, and affecting the display effect of the display substrate.

In order to solve at least one of the above technical problems, embodiments of the present disclosure provide a display substrate and a display device, and the display substrate and the display device provided by the embodiments of the present disclosure will be described in further detail with reference to the accompanying drawings and implementations.

Figure 3:
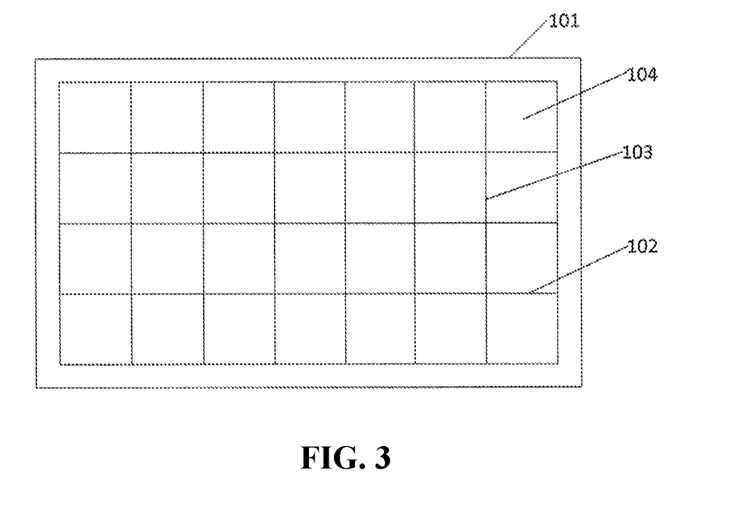
FIG. 3 is a schematic structural diagram of a display substrate according to an embodiment of the present disclosure.

In a first aspect, an embodiment of the present disclosure provides a display substrate, and FIG. 3 is a schematic structural diagram of the display substrate provided in the embodiment of the present disclosure, and as shown in FIG. 3, the display substrate includes: a base 101, gate scanning lines 102 and data signal lines 103 which are arranged on the base 101 and intersected with each other, and pixel units 104 arranged in regions defined by the gate scanning lines 102 and the data signal lines 103.

Figure 4:
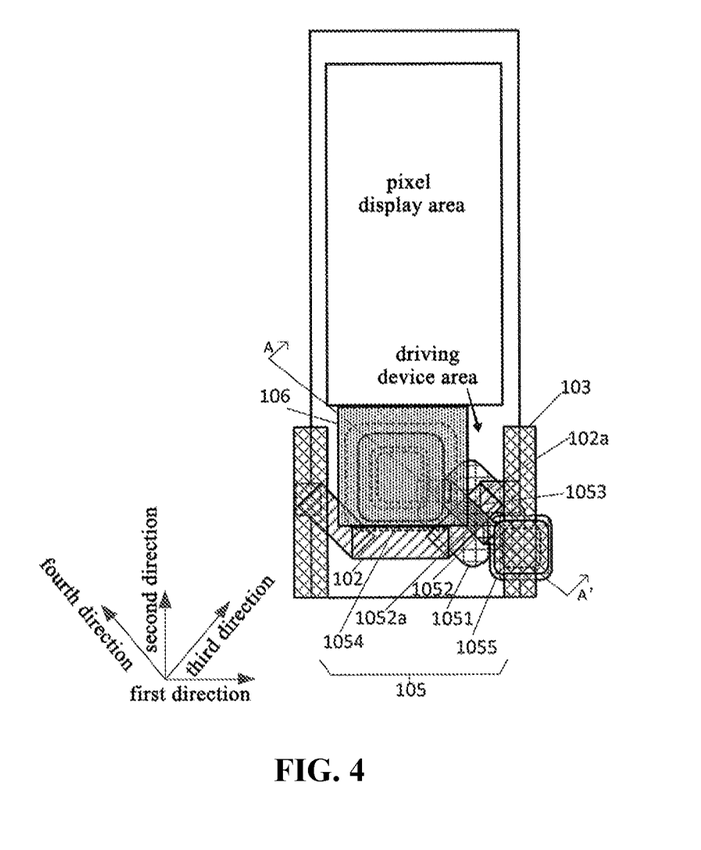
FIG. 4 is a schematic structural diagram of a pixel unit in the display substrate shown in FIG. 3.
Figure 5:
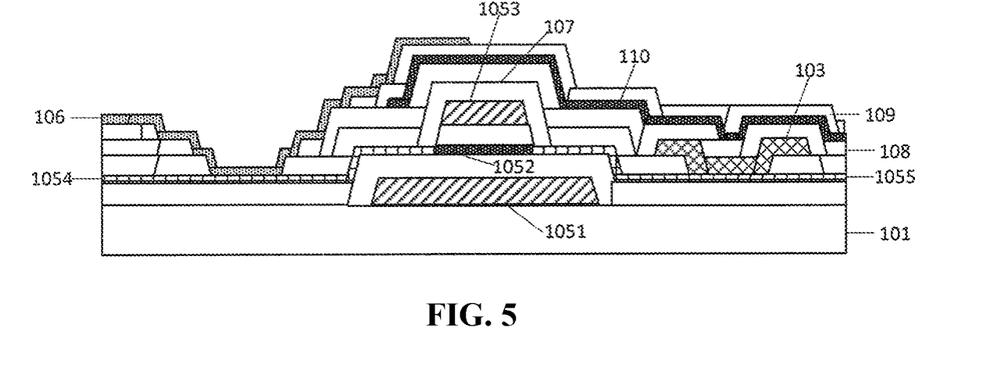
FIG. 5 is a schematic cross-sectional view of the pixel unit shown in FIG. 4 taken along a A-A' direction.

FIG. 4 is a schematic structural diagram of a pixel unit in the display substrate shown in FIG. 3, FIG. 5 is a schematic cross-sectional diagram of the pixel unit shown in FIG. 4 taken along a A-A' direction, and as shown in FIG. 4 and FIG. 5, each pixel unit 104 has a pixel display area and a driving device area disposed at a side of the pixel display area; each gate scanning line 102 runs through the driving device area, and a portion of the gate scanning line 102 is bent towards the pixel display area to form a bent portion 102a. Each pixel unit 104 includes a plurality of thin film transistors 105 disposed in the driving device area, and each thin film transistor 105 includes a semiconductor layer 1052 located on the base 101, where a length direction of the bent portion 102a intersects with a length direction of the semiconductor layer 1052, and an orthographic projection of the bent portion 102a on the base 101 at least partially overlaps with an orthographic projection of the semiconductor layer 1052 on the base 101, a portion of the semiconductor layer 1052 overlapping with the bent portion 102a forms a channel 1052a, and a portion of the bent portion 102a overlapping with the semiconductor layer 1052 serves as a gate electrode 1053 of the thin film transistor 105.

The base 101 may be made of a rigid material such as glass, which can improve the carrying capacity of the base 101 for other film layers thereon. Certainly, the base 101 may also be made of a flexible material such as Polyimide (PI), which can improve an overall bending resistance and tensile resistance of the metal oxide thin film transistor, and avoid the base 101 from being broken to cause a defect of broken circuit due to a stress generated during bending, stretching, and twisting processes. In practical applications, the material of the base 101 may be selected reasonably as desired, so as to ensure that the metal oxide thin film transistor has good performance.

The gate electrode 1053 and the gate scanning line 102 may be formed into an integral structure (i.e., one piece), and the gate electrode 1053 is a part of the gate scanning line 102, which may be made of at least one of gold (Au), silver (Ag), copper (Cu), nickel (Ni), platinum (Pt), palladium (Pd), aluminum (Al), molybdenum (Mo), and chromium (Cr), and may be formed as a single-layered structure made of a single material, for example, a single-layered structure made of aluminum (Al), or may be formed as a multi-layered structure made of multiple different materials, for example, a three-layered structure made of molybdenum (Mo), aluminum (Al), and molybdenum (Mo). The gate scanning line 102 may run through the driving device area to provide a gate scanning signal to the thin film transistor in the driving device area.

The data signal line 103 may be made of at least one of gold (Au), silver (Ag), copper (Cu), nickel (Ni), platinum (Pt), palladium (Pd), aluminum (Al), molybdenum (Mo), and chromium (Cr), may be formed as a single-layered structure made of a single material, for example, a single-layered structure made of aluminum (Al), and may be formed as a multi-layered structure made of multiple different materials, for example, a three-layered structure made of molybdenum (Mo), aluminum (Al), and molybdenum (Mo). The data signal line 103 may run through the driving device area to provide a data signal to the thin film transistor in the driving device area.

The semiconductor layer 1052 may be made of at least one of Indium Gallium Zinc Oxide (IGZO), Indium Gallium Tin Oxide (IGTO), Indium Zinc Oxide (IZO), Indium Tin Oxide (ITO), and Indium Tin Zinc Oxide (ITZO), which are all metal oxides with high mobility, so as to ensure that the overall metal oxide thin film transistor has high mobility. The channel 1052a of the semiconductor layer 1052 may be located at a central region of the semiconductor layer 1052. The channel 1052a of the semiconductor layer 1052 may be conducted by the gate scanning signal input from the gate electrode 1053 to transmit the data signal input from the data signal line 103.

In the display substrate provided in the embodiment of the present disclosure, the gate scanning line 102 may generally extend along a horizontal direction (i.e., the first direction shown in FIG. 4), and the data signal line 103 may extend along a vertical direction (i.e., the second direction shown in FIG. 4), where a portion of the gate scanning line 102 is bent towards the pixel display area (i.e., in a third direction shown in FIG. 4) to form a bent portion 102a, the formed bent portion 102a extends along the third direction shown in FIG. 4, the third direction is a length direction of the bent portion 102a, and the length direction of the bent portion 102a forms an included angle with the horizontal direction, accordingly, the semiconductor layer 1052 may extend along a fourth direction shown in FIG. 4, that is, the fourth direction is a length direction of the semiconductor layer 1052. The length direction of the semiconductor layer 1052 intersects with the length direction of the bent portion 102a, where a portion of the semiconductor layer 1052 overlapping with the bent portion 102a forms a channel 1052a, and a portion of the bent portion 102a overlapping with the semiconductor layer 1052 serves as a gate electrode 1053 of the thin film transistor 105. In this way, the gate electrode 1053 and the channel 1052a of the thin film transistor 105 may both approach towards the pixel display area, so that a total length of the whole thin film transistor 105 in the second direction can be reduced, for example, in the display substrate shown in FIG. 4, the total length of the thin film transistor 105 in the second direction can be reduced from an original length of 21 micrometers to a length of 16 micrometers, it can be seen that the area occupied by the thin film transistor 105 can be reduced to 16/21 of the original area occupied, so that it is unnecessary to use a black matrix with a large area to shield the thin film transistor 105, and the effective display area in the pixel unit is increased, thereby the aperture ratio of the pixel in the display substrate can be increased, the light transmittance of the display substrate is increased, and the display effect of the display substrate is further improved.

It should be noted that, the included angle between the third direction and the first direction or between the third direction and the second direction is only exemplary, and an angle value of the included angle may be selected as desired. Likewise, an included angle between the fourth direction and the first direction or between the fourth direction and the second direction is only exemplary, and an angle value of the included angle may be selected as desired.

In some implementations, an included angle between the length direction of the bent portion 102a and the extending direction in which the gate scanning line 102 extends ranges from 30 degrees to 60 degrees.

The bent portion 102a may be bent towards the pixel display area at a certain bending angle, specifically, the bending angle may range from 30 degrees to 60 degrees, so as to ensure that the gate electrode 1053 and the channel 1052a formed can both approach towards the pixel display area, thereby reducing the total length of the whole thin film transistor 105 in the second direction, so that the area occupied by the thin film transistor 105 may be significantly reduced, and it is unnecessary to shield the thin film transistor 105 by using a black matrix with a larger area, the effective display area in the pixel unit is increased, thereby increasing the aperture ratio of the pixel in the display substrate, increasing the light transmittance of the display substrate, and further improving the display effect of the display substrate. It should be noted that the bending angle can not be too small, and if the bending angle is too small, a distance that the formed gate electrode 1053 approaches towards the pixel display area is also small, and the effect of significantly reducing the total length of the whole thin film transistor 105 in the second direction cannot be achieved. In some implementations, the bending angle of the bent portion 102a may be 45 degrees, so as to improve the aperture ratio of the pixel in the display substrate, reduce the process difficulty of the gate scanning line 102, and save the manufacturing cost.

In some implementations, the included angle between the length direction of the bent portion 102a and the length direction of the semiconductor layer 1052 ranges from 60 degrees to 90 degrees.

The bent portion 102a and the semiconductor layer 1052 may at least partially overlap, and the included angle between the length directions of the bent portion 102a and the semiconductor layer 1052 may range from 60 degrees to 90 degrees. When the included angle between the length direction of the bent portion 102a and the length direction of the channel 1052a is relatively small, for example, is about 60 degrees, an area of an overlapping region between the bent portion 102a and the semiconductor layer 1052 may be increased, so that a length and a width of the channel 1052a in the semiconductor layer 1052 may be increased to improve mobility of the thin film transistor 105. When the included angle between the length direction of the bent portion 102a and the length direction of the channel 1052a is relatively large, for example, is about 90 degrees, in the manufacturing process, the process difficulty can be reduced, and the manufacturing cost can be saved. For example, the included angle between the length direction of the bent portion 102a and the length direction of the channel 1052a may be about 90 degrees.

In some implementations, the semiconductor layer 1052 further includes a source electrode 1054 and a drain electrode 1055 respectively disposed at two ends of the channel 1052a, where the source electrode 1054 and the drain electrode 1055 are both formed by making the two ends of the channel conductive.

In practical applications, an ion concentration at two ends of the semiconductor layer 1052 may be made larger than that of the channel 1052 at the central portion of the semiconductor layer 1052 by heavily doping, so that the two ends of the semiconductor layer 1052 is conductive to form the source electrode 1054 and the drain electrode 1055. Specifically, a plasma treatment may be performed on a region, where the channel 1052 at the central portion of the semiconductor layer 1052 is located, by using a hydrogen ($H_2$) or helium (He) plus argon (Ar) plasma gas. Since the source electrode 1054 and the drain electrode 1055 are formed by directly making the two ends of the semiconductor layer 1052 conductive, it is unnecessary to use a separate metal layer to prepare the source electrode 1054 and the drain electrode 1055 of the thin film transistor 105, so as to reduce the area occupied by the thin film transistor 105, thereby improving the aperture ratio of the pixel in the display substrate, improving the light transmittance of the display substrate, and further improving the display performance of the display product. On the other hand, since it is unnecessary to use a separate metal layer to prepare the source electrode 1054 and the drain electrode 1055 of the thin film transistor 105, a number of film layers in the thin film transistor 105 can be reduced, thereby reducing a thickness of the thin film transistor 105, and simultaneously, process steps of separately forming the source electrode 1054 and the drain electrode 1055 are saved, thus the process cost is reduced.

In some implementations, as shown in FIG. 5, the display substrate further includes an interlayer insulating layer 107 on a side of the source electrode 1054 and the drain electrode 1055 away from the base 101, where the drain electrode 1055 is electrically connected to the data signal line 103 through a via hole penetrating through the interlayer insulating layer 107.

The interlayer insulating layer 107 may prevent short-circuit between the source and drain electrodes 1054 and 1055 of the thin film transistor and other layers thereon from occurring, thereby improving the stability of the thin film transistor. The interlayer insulating layer 107 may be made of at least one of silicon nitride (SiN) and silicon oxide ($SiO_2$), and may be formed as a single-layered structure made of a single material, or may be formed as a multi-layered structure made of a plurality of different materials. The drain electrode 1055 may be electrically connected to the data signal line 103 through the via hole penetrating through the interlayer insulating layer 107, and when a gate scanning signal is input to the gate electrode 1052, the source electrode 1054 and the drain electrode 1055 are conducted, and a data signal transmitted by the data signal line 103 may be transmitted to the source electrode 1054 through the drain electrode 1055, so that transmission of the data signal is achieved.

In some implementations, as shown in FIG. 5, the display substrate further includes a first passivation layer 108, a second passivation layer 109 and a pixel electrode 106 which are sequentially arranged on the interlayer insulating layer 107 along a direction away from the base 101, where the source electrode 1054 is electrically connected to the pixel electrode 106 through a via hole penetrating through the interlayer insulating layer 107, the first passivation layer 108, and the second passivation layer 109.

Each of the first passivation layer 108 and the second passivation layer 109 may be made of at least one of silicon nitride (SiN) and silicon oxide (SiO$_2$), and may be formed as a single-layered structure made of a single material, or may be formed as a multi-layered structure made of a plurality of different materials. The pixel electrode 106 may be made of a transparent conductive material such as Indium Tin Oxide (ITO) to avoid the pixel electrode 106 shielding light, and improve the overall light transmittance of the display substrate. The source electrode 1054 may be electrically connected to the pixel electrode 106 through a via hole penetrating through the interlayer insulating layer 107, the first passivation layer 108, and the second passivation layer 109, and after the source electrode 1054 and the drain electrode 1055 are conducted, the data signal on the data signal line 103 may be transmitted to the pixel electrode 106, so as to implement transmission of the data signal. In an implementation of the present disclosure, no other film layer (e.g., a planarization layer and the like) is disposed between the first passivation layer 108 and the second passivation layer 109, and it is unnecessary to make the via hole penetrate through too many film layers, so as to reduce a size of the via hole, so that the size of the thin film transistor 105 and the area occupied by the thin film transistor 105 can be reduced, the aperture ratio of the pixel in the display substrate can be increased, the light transmittance of the display substrate can be increased, and the display performance of the display product can be further improved.

In some implementations, as shown in FIG. 5, the display substrate further includes a common electrode 110 located between the first passivation layer 108 and the second passivation layer 109, where an orthographic projection of the common electrode 110 on the base 101 at least partially overlaps with an orthographic projection of the pixel electrode 106 on the base 101.

The common electrode 110 may be made of a transparent conductive material, such as Indium Tin Oxide (ITO), to prevent the common electrode 110 from shielding light and improve the overall light transmittance of the display substrate. In practical applications, a gate scanning signal transmitted by the gate scanning line 102 may be transmitted to the gate electrode 1053 of the thin film transistor 105 to control the source electrode 1054 to be conducted to the drain electrode 1055, so that the data signal on the data signal line 103 is transmitted to the pixel electrode 106, and with the coordination of a common signal transmitted by the common electrode 110, a driving electric field is formed between the pixel electrode 106 and the common electrode 110 to control the liquid crystal molecules in the liquid crystal layer to deflect, so that light from the backlight module (unit) is transmitted through the liquid crystal layer to realize a display function.

Figure 6:
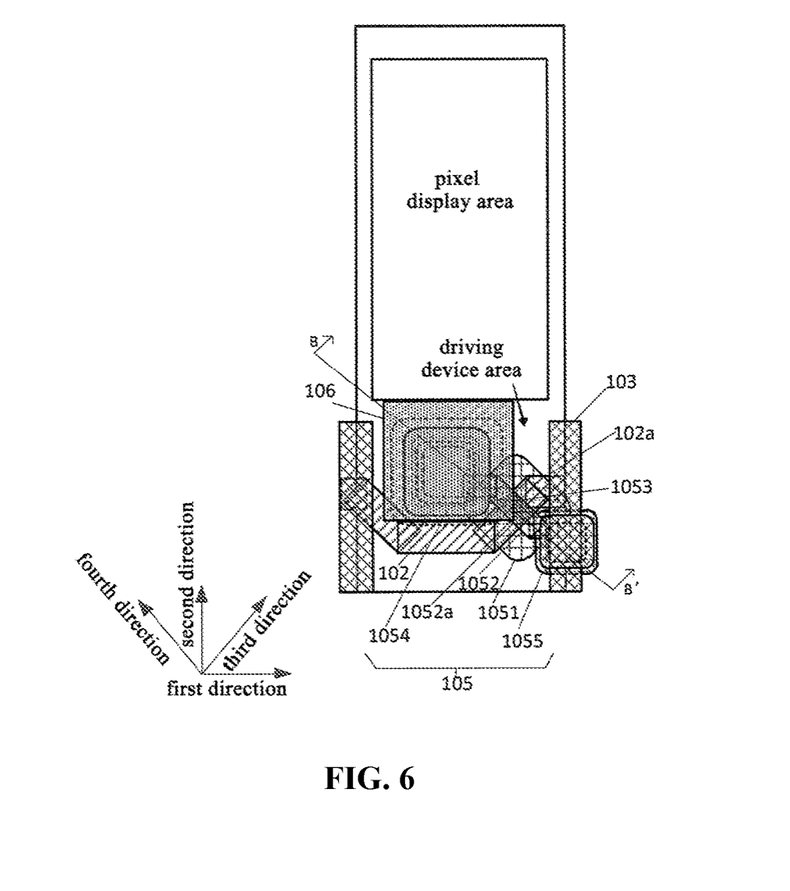
FIG. 6 is a schematic structural diagram of a pixel unit in the display substrate shown in FIG. 3.
Figure 7:
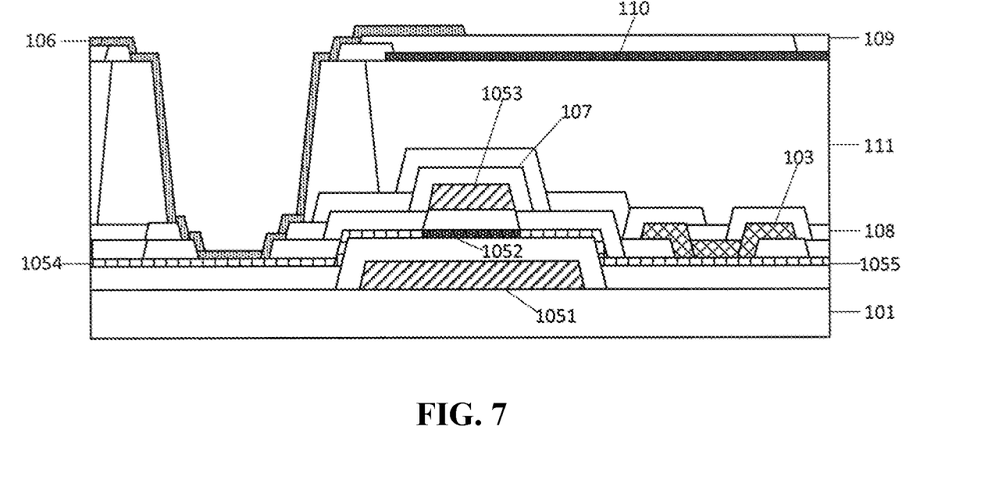
FIG. 7 is a schematic cross-sectional view of the pixel unit shown in FIG. 6 taken along a direction B-B'.

In some implementations, FIG. 6 is a schematic structural diagram of the pixel unit in the display substrate shown in FIG. 3, FIG. 7 is a schematic cross-sectional view of the pixel unit shown in FIG. 6 taken along a direction B-B', and as shown in FIG. 6 and FIG. 7, the display substrate further includes a planarization layer 111 located between the first passivation layer 108 and the second passivation layer 109, where the source electrode 1054 is electrically connected to the pixel electrode 106 through a via hole penetrating through the interlayer insulating layer 107, the first passivation layer 108, the planarization layer 111, and the second passivation layer 109.

The planarization layer 111 may be made of organic materials such as acryl, resin, polyimide, or benzocyclobutene, which may be specifically selected as desired. The planarization layer 111 is arranged between the first passivation layer 108 and the second passivation layer 109, and the planarization layer 111 can planarize a surface of a film layer formed by the thin film transistor 105, so that other film layers formed on the thin film transistor 105 can be attached to a relatively flat attaching surface, thereby ensuring the attaching flatness. In addition, with the planarization layer 111, a distance between the source electrode 1054 and other conductive film layers in the thin film transistor 105 can be increased, avoiding parasitic capacitance generating between the source electrode 1054 or the drain electrode 1055 and other conductive film layers above the source electrode 1054 or the drain electrode 1055.

Figure 8:
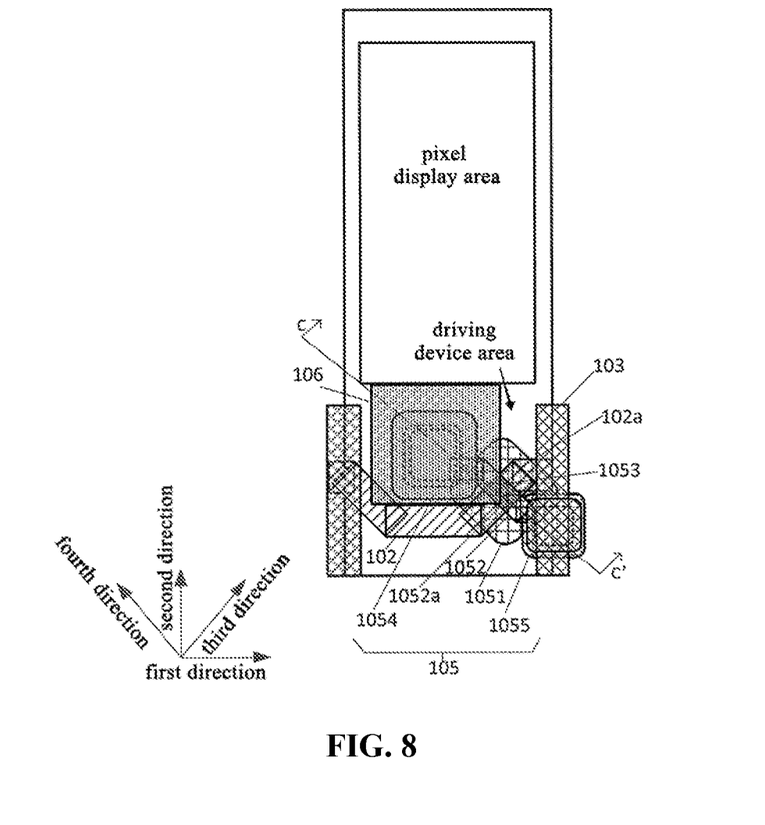
FIG. 8 is a schematic structural diagram of a pixel unit in the display substrate shown in FIG. 3.
Figure 9:
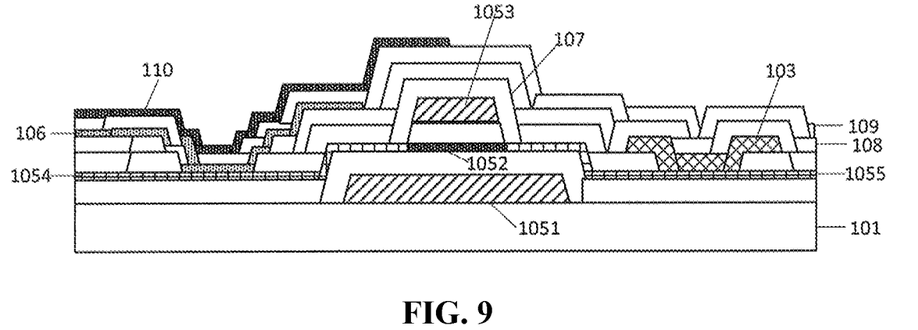
FIG. 9 is a schematic cross-sectional view of the pixel unit shown in FIG. 8 taken along a direction C-C'.

In some implementations, FIG. 8 is a schematic structural diagram of a pixel unit in the display substrate shown in FIG. 3, FIG. 9 is a schematic cross-sectional view of the pixel unit shown in FIG. 8 taken along a direction C-C', and as shown in FIG. 8 and FIG. 9, the display substrate further includes a common electrode 110 on a side of the second passivation layer 109 away from the base 101, where an orthographic projection of the common electrode 110 on the base 101 at least partially overlaps with an orthographic projection of the pixel electrode 106 on the base 101.

The structure shown in FIG. 9 is different from the structures shown in FIGS. 5 and 7 in that the common electrode 110 may be disposed on a side of the second passivation layer 109 away from the base 101. In practical applications, the common electrode 110 is usually a surface electrode, and in the structures shown in FIGS. 5 and 7, since the common electrode 110 is disposed at a side of the pixel electrode 106 close to the base 101, a via hole penetrating through the common electrode 110 is required to be formed when the pixel electrode 106 is connected to the source electrode 1054 of the thin film transistor 105. In the structure shown in FIG. 9, the common electrode 110 is farther away from the base 101 than the pixel electrode 106, and the via hole between the pixel electrode 106 and the source electrode 1054 does not need to penetrate through the common electrode 110, so that the size of the via hole is reduced, thereby reducing the size of the thin film transistor 105 and the area occupied by the thin film transistor, the aperture ratio of the pixel in the display substrate is improved, the light transmittance of the display substrate is improved, and the display performance of the display product is further improved.

In some implementations, as shown in FIGS. 4 to 9, the display substrate further includes a light-shielding layer 1051 located between the base 101 and the channel 1052a, where an orthographic projection of the channel 1052a on the base 101 falls within an orthographic projection of the light-shielding layer 1051 on the base 101.

The light-shielding layer 1051 may be made of at least one of gold (Au), silver (Ag), copper (Cu), nickel (Ni), platinum (Pt), palladium (Pd), aluminum (Al), molybdenum (Mo), and chromium (Cr), may be formed as a single-layered structure made of a single material, for example, a single-layered structure made of aluminum (Al), and certainly, may also be formed as a multi-layered structure made of multiple different materials, for example, a three-layered structure made of molybdenum (Mo), aluminum (Al), and molybdenum (Mo). The light-shielding layer 1051 can shield the channel 1052a of the semiconductor layer 102 to prevent light, incident from the base 101, from irradiating to the channel 1052a of the semiconductor layer 102, thereby improving stability of the thin film transistor 105.

FIGS. 10a to 10k are schematic diagrams of intermediate structures, at various process stages, of the display substrate provided in an embodiment of the present disclosure, and the process for manufacturing the display substrate provided by the embodiment of the present application will be further described in detail with the accompanying drawings, by taking the structure of the display substrate shown in FIG. 6 and FIG. 7 as an example.

Figure 10A:
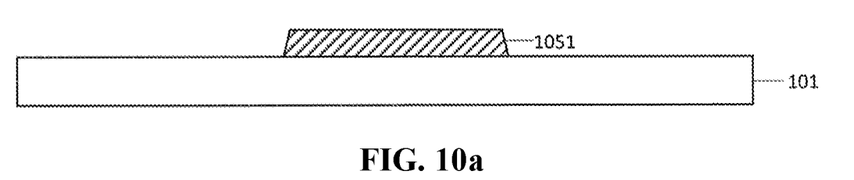
FIGS. 10a to 10k are schematic diagrams of intermediate structures of the display substrate, at various process stages, provided in an embodiment of the present disclosure.

As shown in FIG. 10a, a first metal layer is formed on a base 101 and is patterned to form a light-shielding layer 1051 for a thin film transistor 105.

Figure 10B:
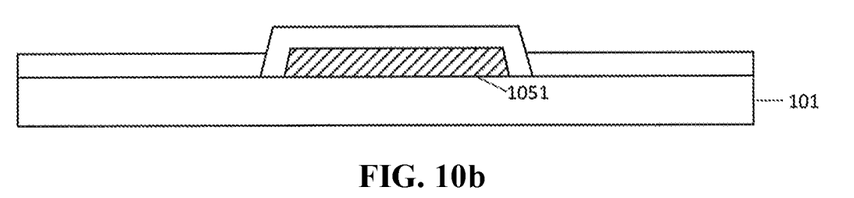

As shown in FIG. 10b, a first insulating layer is formed on the light-shielding layer 1051, and specifically, the first insulating layer may be a buffer layer made of at least one of silicon nitride, silicon oxide, and silicon oxynitride.

Figure 10C:
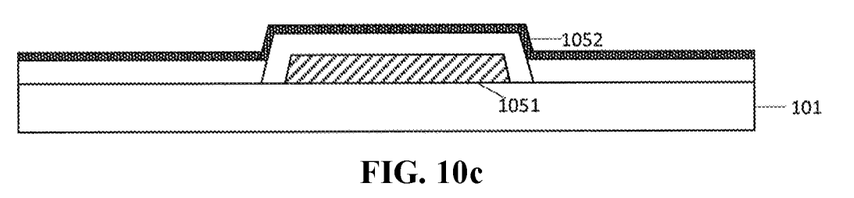

As shown in FIG. 10c, a semiconductor layer 1052 is formed on the first insulating layer, and the semiconductor layer 1052 may be made of at least one of Indium Gallium Zinc Oxide (IGZO), Indium Gallium Tin Oxide (IGTO), Indium Zinc Oxide (IZO), Indium Tin Oxide (ITO), and Indium Tin Zinc Oxide (ITZO). The semiconductor layer 1052 may be divided into a channel region, a source region, and a drain region.

Figure 10D:
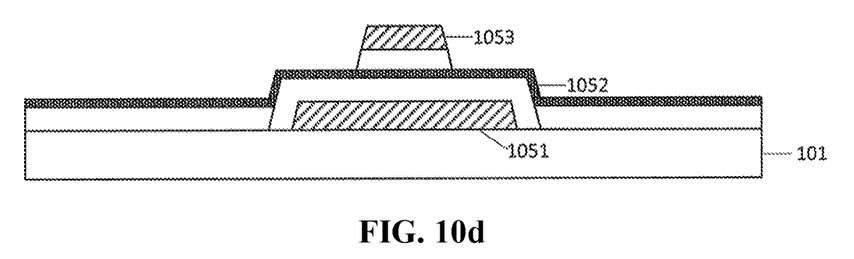

As shown in FIG. 10d, a second insulating layer is formed on the semiconductor layer 1052, and the second insulating layer may be a gate insulating layer, which may be made of at least one of silicon nitride, silicon oxide, and silicon oxynitride. A second metal layer, which may be a gate scanning lines 102 and a gate 1053 of the thin film transistor 105, is formed on the second insulating layer.

Figure 10E:
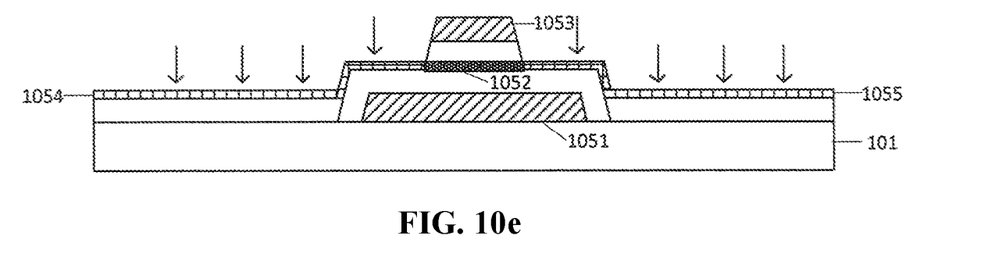

As shown in FIG. 10e, portions of the semiconductor layer 1052 not shielded by the gate electrode 1053, that is, a source region and a drain region, are subjected to a doping process using a plasma process gas with the gate electrode 1053 as a mask, so that the source region and the drain region of the semiconductor layer 1052 are conductive to form a source electrode 1054 and a drain electrode 1055 of the thin film transistor 105.

Figure 10F:
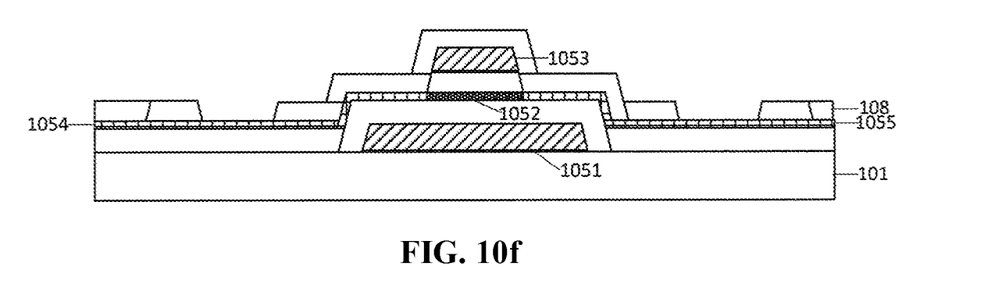

As shown in FIG. 10f, a third insulating layer is formed on the second metal layer, specifically, the third insulating layer may be an interlayer insulating layer 107, and the interlayer insulating layer 107 may be made of at least one of silicon nitride, silicon oxide, and silicon oxynitride. The third insulating layer is subjected to a patterning process to expose the source electrode 1054 and the drain electrode 1055 in the semiconductor layer 1052.

Figure 10G:
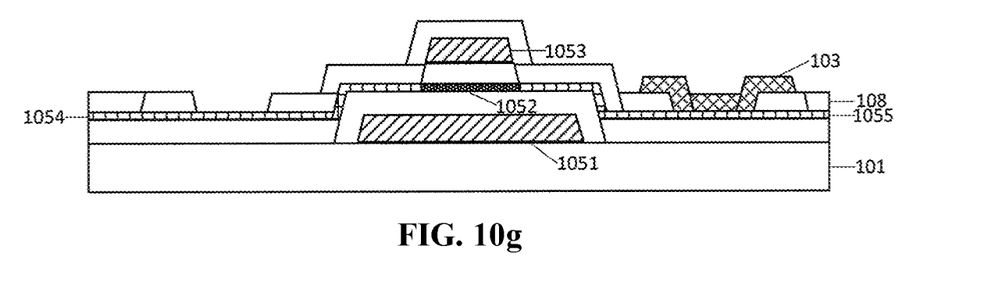

As shown in FIG. 10g, a third metal layer, which may be a data signal line 103, is formed on the third insulating layer at a position where the drain electrode 1055 is exposed. The data signal line 103 may be electrically connected to the drain electrode 1055 to input a data signal to the drain electrode 1055.

Figure 10H:
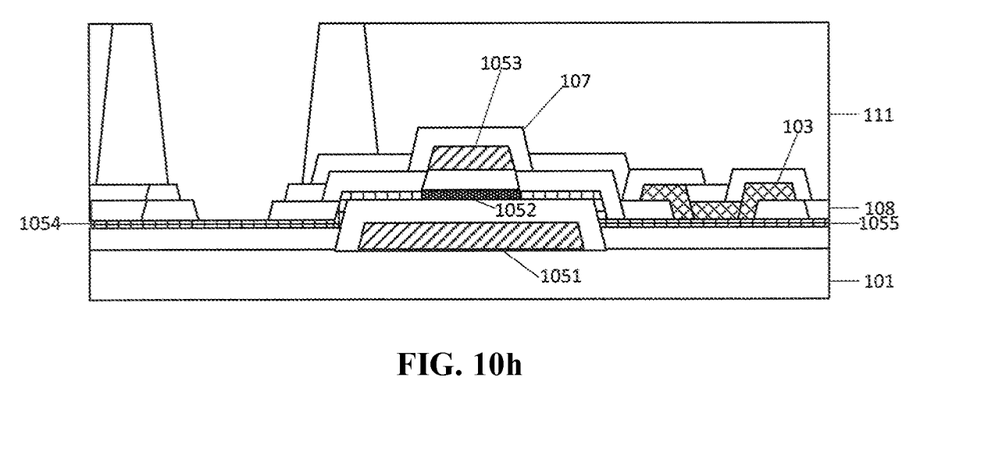

As shown in FIG. 10h, a fourth insulating layer and a fifth insulating layer are formed on the third metal layer. Specifically, the fourth insulating layer may be a first passivation layer 108, and the fifth insulating layer may be a planarization layer 111. The first passivation layer 108 may be made of at least one of silicon nitride, silicon oxide, or silicon oxynitride, and the planarization layer 111 may be made of an organic material such as acryl, resin, polyimide, or benzocyclobutene.

Figure 10I:
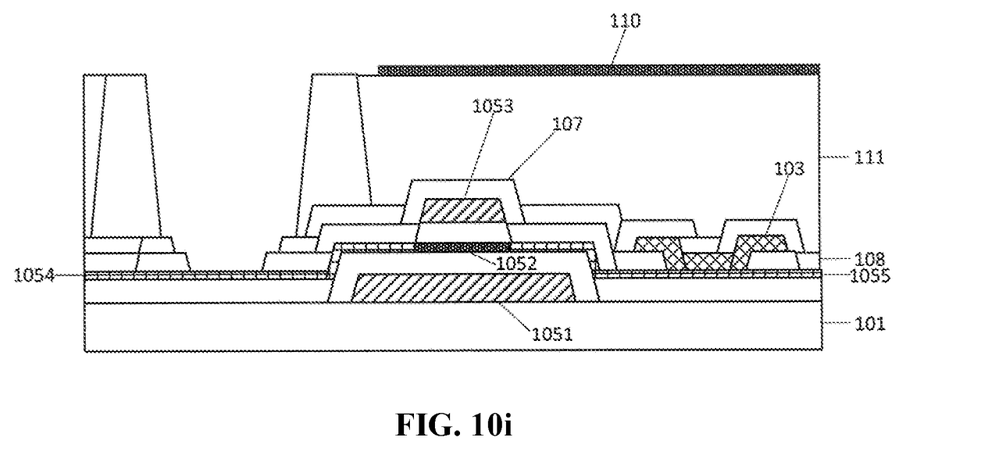

As shown in FIG. 10i, a common electrode 110 is formed on the fifth insulating layer, and the common electrode 110 may be made of a transparent material such as Indium Tin Oxide (ITO).

Figure 10J:
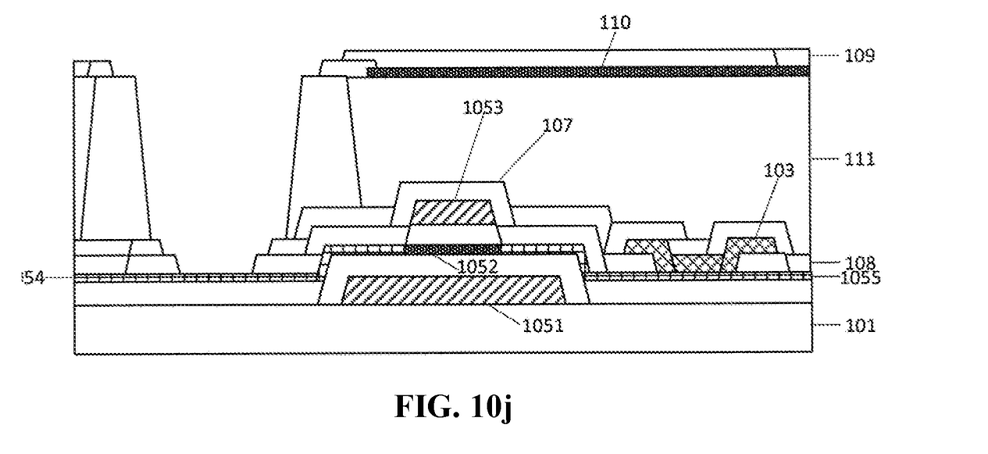

As shown in FIG. 10j, a sixth insulating layer is formed on the common electrode 110, and specifically, the sixth insulating layer may be a second passivation layer 109, and the second passivation layer 109 may be made of at least one of silicon nitride, silicon oxide, or silicon oxynitride.

Figure 10K:
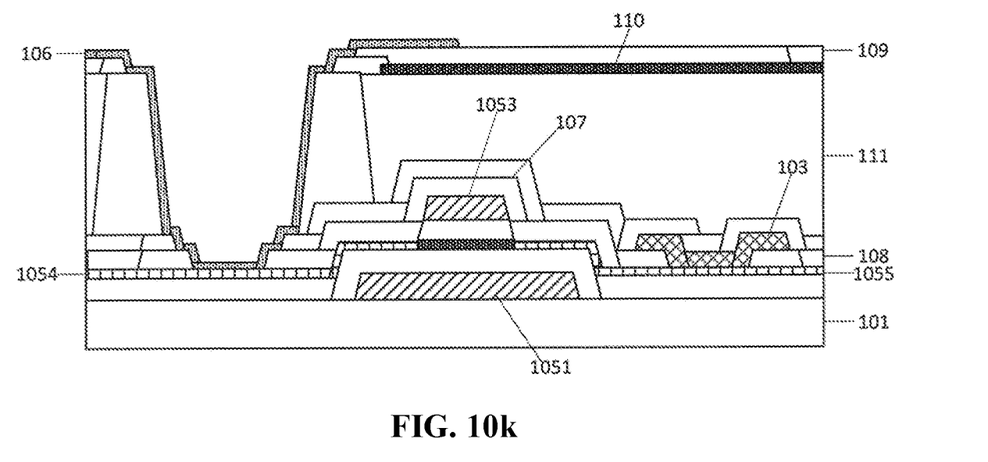

As shown in FIG. 10k, a pixel electrode 106 is formed on the sixth insulating layer such that the pixel electrode 106 is electrically connected to the source electrode 1054 through a via hole penetrating through the interlayer insulating layer, the first passivation layer 108, and the second passivation layer 109.

In a second aspect, an embodiment of the present disclosure provides a display device, where the display device includes the display substrate provided in any one of the embodiments described above, and the display device may be any product or component with a display function, such as a mobile phone, a tablet computer, a television, a display, a notebook computer, a digital photo frame, a navigator, implementation principle and beneficial effect of the display device are the same as those of the display substrate described above, and are not described herein again.

It is to be understood that the above embodiments are merely exemplary embodiments adopted to illustrate the principles of the present disclosure, and the present disclosure is not limited thereto. It will be apparent to those skilled in the art that various improvements and modifications can be made therein without departing from the spirit and scope of the present disclosure, and such improvements and modifications are to be considered within the protective scope of the present disclosure.

What is claimed is:

1. A display substrate, comprising: a base, gate scanning lines and data signal lines which are arranged on the base and intersected with each other, and pixel units arranged in regions defined by the gate scanning lines and the data signal lines;
    each pixel unit has a pixel display area and a driving device area arranged on a side of the pixel display area, each gate scanning line runs through the driving device area, in each pixel unit, the gate scanning line comprises a body portion, a first bent portion, and a second bent portion, the body portion being located between and connected to the first bent portion and the second bent portion, the first bent portion and the second bent portion bend extending from the body portion towards the display area, and orthographic projection of ends of the first bent portion and the second bent portion away from the body portion on the base overlaps with orthographic projections of the data lines adjacent thereto on the substrate, respectively;
    each pixel unit comprises a plurality of thin film transistors disposed in the driving device area, and each thin film transistor comprises a semiconductor layer on the base;

a length direction of the first bent portion is intersected with a length direction of the semiconductor layer, and an orthographic projection of the first bent portion on the base is at least partially overlapped with an orthographic projection of the semiconductor layer on the base; and a part of the semiconductor layer overlapping with the first bent portion forms a channel, and a part of the first bent portion overlapping with the semiconductor layer serves as a gate electrode of the thin film transistor.

2. The display substrate of claim 1, wherein an included angle between the length direction of the first bent portion and an extending direction in which the gate scanning line extends ranges from 30 degrees to 60 degrees.

3. The display substrate of claim 2, wherein an included angle between the length direction of the first bent portion and a length direction of the semiconductor layer ranges from 60 degrees to 90 degrees.

4. The display substrate of claim 1, wherein the semiconductor layer further comprises a source electrode and a drain electrode respectively arranged at two ends of the channel; and the source electrode and the drain electrode are formed by a conductive treatment.

5. The display substrate of claim 4, further comprising an interlayer insulating layer located on a side, away from the base, of the source electrode and the drain electrode;

the drain electrode is electrically connected to the data signal line through a via hole penetrating through the interlayer insulating layer.

6. The display substrate of claim 5, further comprising a first passivation layer, a second passivation layer and a pixel electrode sequentially arranged on the interlayer insulating layer along a direction away from the base;

the source electrode is electrically connected to the pixel electrode through a via hole penetrating through the interlayer insulating layer, the first passivation layer, and the second passivation layer.

7. The display substrate of claim 6, further comprising a common electrode located between the first passivation layer and the second passivation layer;

an orthographic projection of the common electrode on the base at least partially overlaps with an orthographic projection of the pixel electrode on the base.

8. The display substrate of claim 6, further comprising a planarization layer located between the first passivation layer and the second passivation layer;

the source electrode is electrically connected to the pixel electrode through a via hole penetrating through the interlayer insulating layer, the first passivation layer, the planarization layer, and the second passivation layer.

9. The display substrate of claim 8, further comprising a common electrode located between the planarization layer and the second passivation layer;

an orthographic projection of the common electrode on the base at least partially overlaps with an orthographic projection of the pixel electrode on the base.

10. The display substrate of claim 6, further comprising a common electrode located on a side, away from the base, of the second passivation layer;

an orthographic projection of the common electrode on the base at least partially overlaps with an orthographic projection of the pixel electrode on the base.

11. The display substrate of claim 1, further comprising a light-shielding layer located between the base and the channel;

an orthographic projection of the channel on the base falls within an orthographic projection of the light-shielding layer on the base.

12. A display device, comprising the display substrate of claim 1.

13. The display substrate of claim 8, further comprising a common electrode located on a side, away from the base, of the second passivation layer;

an orthographic projection of the common electrode on the base at least partially overlaps with an orthographic projection of the pixel electrode on the base.

* * * * *